(12) United States Patent
Sun et al.

(10) Patent No.: US 10,234,915 B2
(45) Date of Patent: Mar. 19, 2019

(54) GRAPHITE THERMAL CONDUCTOR, ELECTRONIC DEVICE AND METHOD FOR MANUFACTURING GRAPHITE THERMAL CONDUCTOR

(71) Applicant: HTC Corporation, Taoyuan (TW)

(72) Inventors: Chin-Kai Sun, Taoyuan (TW); Jen-Cheng Lai, Taoyuan (TW); Jia-Yuan Hsu, Taoyuan (TW); Yi-Chang Huang, Taoyuan (TW); Chieh-Pei Chou, Taoyuan (TW)

(73) Assignee: HTC Corporation, Taoyuan (TW)

( * ) Notice: Subject to any disclaimer, the term of this patent is extended or adjusted under 35 U.S.C. 154(b) by 171 days.

(21) Appl. No.: 14/848,333

(22) Filed: Sep. 9, 2015

(65) Prior Publication Data

US 2017/0067701 A1  Mar. 9, 2017

(51) Int. Cl.
*G06F 1/20* (2006.01)
*B32B 37/14* (2006.01)
(Continued)

(52) U.S. Cl.
CPC .............. *G06F 1/203* (2013.01); *B32B 37/14* (2013.01); *B32B 37/18* (2013.01); *B32B 38/0004* (2013.01); *H01L 23/36* (2013.01); *H01L 23/373* (2013.01); *H05K 1/0209* (2013.01); *B32B 2307/202* (2013.01); *B32B 2307/302* (2013.01);
(Continued)

(58) Field of Classification Search
CPC ........ B32B 2307/202; B32B 2307/302; B32B 2307/304; B32B 2313/04; B32B 2457/08; B32B 37/14; B32B 37/18; B32B 38/0004; F28F 21/02; F28F 13/18; G06F 1/203; H05K 1/0203
See application file for complete search history.

(56) References Cited

U.S. PATENT DOCUMENTS 4,867,235 A * 9/1989 Grapes ................ H01L 23/3733
165/185
6,270,083 B1   8/2001 Hirschvogel et al.
(Continued)

FOREIGN PATENT DOCUMENTS

CN       201115224       9/2008
CN       202931733       5/2013
(Continued)

OTHER PUBLICATIONS

"Office Action of Taiwan Counterpart Application", dated Apr. 26, 2016, p. 1-p. 6.
(Continued)

*Primary Examiner* — James Wu
*Assistant Examiner* — Hung Dang
(74) *Attorney, Agent, or Firm* — JCIPRNET (57) ABSTRACT

A graphite thermal conductor includes graphite bands laminated in the thickness direction. The thermal conductivity coefficient of each graphite band in the extending path is greater than the thermal conductivity coefficient thereof in the thickness direction. The extending path of each graphite band has at least one first bend in a plane which is perpendicular to the thickness direction. An electronic device applying the above graphite thermal conductor and a method for manufacturing graphite thermal conductor are also provided.

12 Claims, 6 Drawing Sheets

(51) Int. Cl.
*B32B 38/00* (2006.01)
*B32B 37/18* (2006.01)
*H01L 23/36* (2006.01)
*H05K 1/02* (2006.01)
*H01L 23/373* (2006.01)

(52) U.S. Cl.
CPC ..... *B32B 2307/304* (2013.01); *B32B 2313/04* (2013.01); *B32B 2457/08* (2013.01); *H05K 2201/0323* (2013.01)

(56) References Cited

U.S. PATENT DOCUMENTS

| | | | |
|---|---|---|---|
| 7,261,146 B2 * | 8/2007 | Oh | C09K 5/14 165/135 |
| 7,494,712 B2 | 2/2009 | Norley et al. | |
| 9,560,735 B1 * | 1/2017 | Planillo | B82Y 30/00 |
| 2002/0166658 A1 | 11/2002 | Norley et al. | |
| 2011/0266326 A1 * | 11/2011 | Rabe | B82Y 30/00 225/103 |
| 2015/0096731 A1 | 4/2015 | Koch et al. | |
| 2015/0189792 A1 * | 7/2015 | Kenna | B23P 15/26 361/704 |

FOREIGN PATENT DOCUMENTS

| | | |
|---|---|---|
| CN | 203697591 | 7/2014 |
| WO | 2014201686 | 12/2014 |

OTHER PUBLICATIONS

"Office Action of China Counterpart Application", dated Apr. 27, 2018, p. 1-p. 7.

* cited by examiner

GRAPHITE THERMAL CONDUCTOR, ELECTRONIC DEVICE AND METHOD FOR MANUFACTURING GRAPHITE THERMAL CONDUCTOR

BACKGROUND OF THE INVENTION

Field of the Application

The application relates to a graphite thermal conductor, and particularly to a graphite thermal conductor and a method for manufacturing a graphite thermal conductor, and an electronic device which uses a graphite thermal conductor as a thermal conductive medium.

Description of Related Art

Due to their diverse functions and thin design appearance, thin mobile devices such as the smart phone and the tablet computer are very popular. These kinds of thin mobile devices are generally provided with components which generate heat such as central processing unit (CPU) or the like, thus a heat dissipation means is necessary to reduce the temperature of these heat generating components, in order to ensure the normal operation of the thin mobile devices. CPUs with higher efficiency are employed in the thin mobile devices, and the CPUs also generate more and more heat, thus employing a heat dissipation means which has a superior efficiency is necessary.

To avoid affecting the normal voice call function, fans which may produce noises cannot be employed for actively dissipating heat in the thin mobile devices (especially, smart phones). Therefore, in some kinds of thin mobile devices, micro heat pipes (i.e., heat pipe with a very thin thickness) are used for heat dissipation. The micro heat pipe may transmit the generated heat generated by the central processing unit of the thin mobile device to other components having comparatively lower temperature, for example, battery or housing of the thin mobile device. Due to limit of apparent thickness of the thin mobile device, in order to avoid the increase of thickness of the thin mobile device, the micro heat pipes are also designed thinner and thinner. On the contrary, the micro heat pipes of the thin mobile devices can withstand less and less energy wattage, and since the micro heat pipes are required to be bent due to space restriction in X-Y directions of the thin mobile device, the bending of the micro heat pipes may substantially reduce the efficiency and success rate of the inner circulation of the micro heat pipes. However, in the case of the thickness being extremely small, the fluid (including liquid and gas) within the micro heat pipe becomes hard to flow, and thereby causing poor stability of heat dissipation of the micro heat pipes. Moreover, during use or assembling process, if the micro heat pipe is compressed and deformed, the heat dissipation efficiency of the micro heat pipe may dramatically be reduced.

Artificial graphite sheets (hereinafter graphite sheets) have relatively superior thermal conductivity efficiency, may smoothly be attached on any of planar surface or curved surface, and may be done any type of cutting as required. Therefore, graphite sheets are widely used as heat dissipation element of the thin mobile devices. However, graphite sheets have a very strong directionality in thermal conductivity properties. The thermal conductivity coefficient of the graphite sheet in the direction of extending surface is about 1500 W/mK, while the thermal conductivity coefficient of the graphite sheet in the thickness direction is about 15 W/mK, the difference therebetween is significant.

Since the thermal conductivity coefficient of the graphite sheet in the thickness direction is very small, the heat of the central processing unit is often unable to be immediately and efficiently dissipated through the graphite sheet which is attached thereon. Therefore, the graphite sheets cannot bring into full play the thermal conductivity efficiency thereof due to their very strong directionality in thermal conductivity properties.

SUMMARY OF THE APPLICATION

The application provides a graphite thermal conductor which can bring into full play thermal conductivity efficiency thereof.

The application provides an electronic device in which a graphite thermal conductor thereof can bring into full play thermal conductivity efficiency.

The application provides a method for manufacturing graphite thermal conductor for manufacturing a graphite thermal conductor having a three-dimensional shape.

The graphite thermal conductor of the application includes a plurality of graphite bands laminated in the thickness direction. The thermal conductivity coefficient of each graphite band in the extending path is greater than the thermal conductivity coefficient thereof in the thickness direction. The extending path of each graphite band has at least one first bend in a plane which is perpendicular to the thickness direction.

The electronic device of the application includes a circuit board, a heat generating component and a graphite thermal conductor. The heat generating component is mounted on the circuit board. The graphite thermal conductor is thermally coupled to the heat generating component. The graphite thermal conductor includes a plurality of graphite bands laminated in the thickness direction. The thermal conductivity coefficient of each graphite band in the extending path is greater than the thermal conductivity coefficient thereof in the thickness direction, and the extending path of each graphite band has at least one first bend in a plane which is perpendicular to the thickness direction.

The method for manufacturing graphite thermal conductor of the application includes steps as follows. A plurality of graphite sheets are bent according to a predetermined shape respectively. The bent graphite sheets are laminated to be a graphite laminated structure. The graphite laminated structure is cut, such that each of the graphite sheets becomes a graphite band, wherein a thermal conductivity coefficient of each graphite band in an extending path is greater than a thermal conductivity coefficient thereof in a thickness direction, the extending path of each graphite band has at least one first bend in a plane which is perpendicular to the thickness direction, and the extending path of each graphite band has at least one second bend in a plane which is parallel to the thickness direction.

In light of the above, the graphite thermal conductor uses the high thermal conductivity in the extending plane of the graphite bands to transmit the heat generated by the heat generating component, so as to rapidly dissipate the heat from the heat generating component. Furthermore, the laminated graphite bands may increase the amount of thermal conductivity per unit cross-sectional area.

To make the above features and advantages of the application more comprehensible, several embodiments accompanied with drawings are described in detail as follows.

DESCRIPTION OF THE EMBODIMENTS

Figure 1:
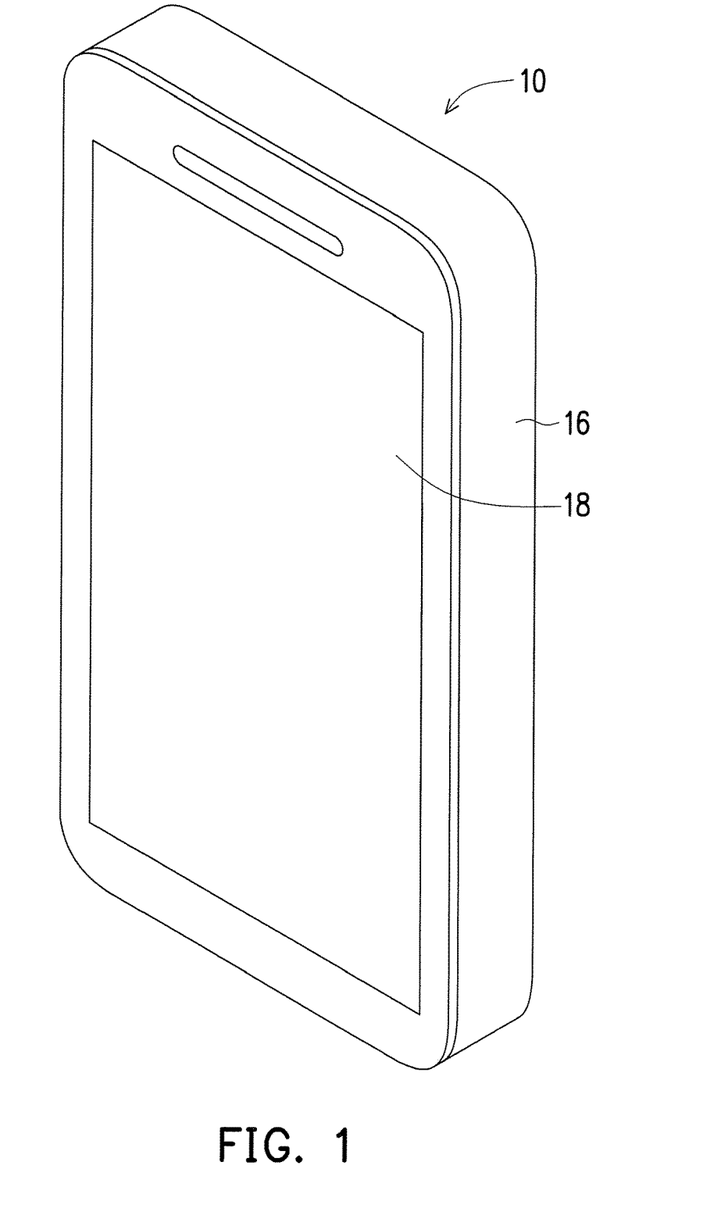
FIG. 1 is a three-dimensional view of an electronic device according to an embodiment of the application.
Figure 2:
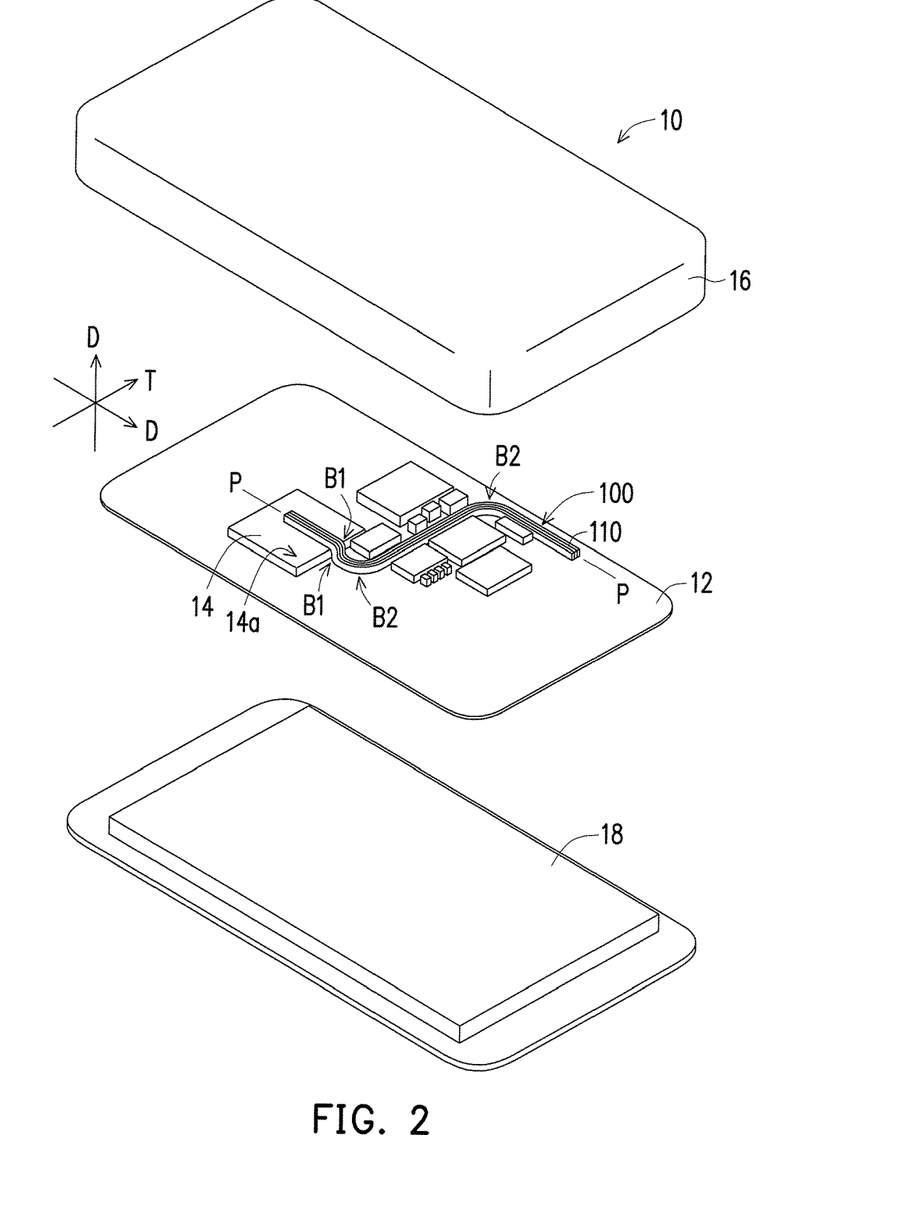
FIG. 2 is an exploded view of the electronic device in FIG. 1.

Referring to FIG. 1 and FIG. 2, in the present embodiment, the electronic device 10 is a thin mobile device, for example a smart phone a tablet computer, or the like. The electronic device 10 includes a circuit board 12, a heat generating component 14, a housing 16 and a display 18. The circuit board 12 may be a mother board, a module board, or the like. The heat generating component 14 is mounted on the circuit board 12. The heat generating component 14 is a component which may generate heat and increase its temperature during operation and need to be cooled down, such as a central processing unit (CPU), a graphic processing unit (GPU), a charging integrated circuit (charging IC), a power choke, a radio frequency power amplifier (RFPA), a power management processor (i.e., a power management integrated circuit (PMIC)), and the like. The housing 16 accommodates the circuit board 12 and the heat generating component 14. The display 18 is mounted on the housing 16 and electrically connected to the circuit board 12, for outputting images to users. In addition, the electronic device 10 further includes a battery (not shown) which is accommodated in the housing 16.

In order to dissipate the heat of the heat generating component 14, in the present embodiment, the electronic device 10 further includes a graphite thermal conductor 100 which is thermally coupled to the heat generating component 14 and transmits the heat generated by the heat generating component 14 to other components having relatively lower temperature, for example other portions of the circuit board 12 located far away from the heat generating component 14, the housing 16 or other components of the electronic device 10.

The graphite thermal conductor 100 includes a plurality of graphite bands 110. The graphite bands 110 are laminated in the thickness direction T. Since each of the graphite bands 110 is formed by the fabrication of graphite sheets (e.g., artificial graphite sheets), each of the graphite bands 110 has a very strong directionality in thermal conductivity properties, such that the thermal conductivity coefficient of each graphite band 110 in the extending path P is greater than the thermal conductivity coefficient thereof in the thickness direction T.

In other embodiments, the extending path P of each graphite band 110 has two first bends B1 in a plane which is perpendicular to the thickness direction T. Therefore, the graphite thermal conductor 100 may extend from the circuit board 12 to the top surface 14a of the heat generating component 14, such that the side of each of the graphite bands 110 is thermally coupled to the top surface 14a of the heat generating component 14. In this configuration, each of the graphite bands 110 may bring into full play its high thermal conductivity characteristic, so as to rapidly dissipate heat from the heat generating component 14.

In the present embodiment, the extending path P of each graphite band 110 further has a plurality of second bends B2 in a plane which is parallel to the thickness direction T. Thus, the graphite thermal conductor 100 may extend on the circuit board 12, so as to bypass other components located on the circuit board 12.

Figure 3:
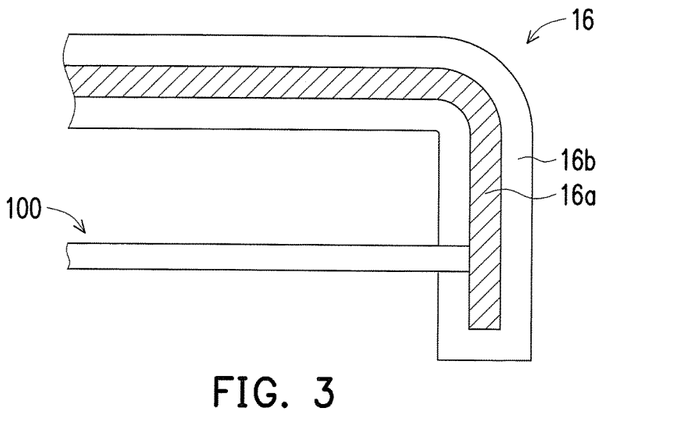
FIG. 3 is a partially enlarged cross-sectional view of a portion of the graphite thermal conductor and a portion of the housing in FIG. 2.

Referring to FIG. 3, compared to the embodiment of FIG. 2, in the present embodiment, the graphite thermal conductor 100 may be thermally coupled to the housing 16. Specifically, the housing 16 of the electronic device 10 includes a metal portion 16a and a plastic portion 16b, wherein the plastic portion 16b may be formed on the metal portion 16a by insert-molding process, and a segment of the graphite thermal conductor 100 may be thermally coupled to the metal portion 16a of the housing 16, which may provide heat dissipation function. In another embodiment not shown, the entire housing 16 may be formed by metal material, for example, magnesium aluminum alloy, and the graphite thermal conductor 100 may also be thermally coupled to the housing 16, which may provide heat dissipation function.

Figure 4:
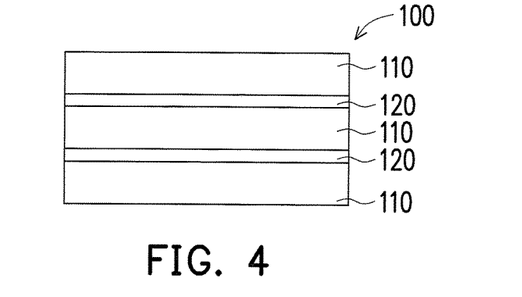
FIG. 4 is an enlarged cross-sectional view of the graphite thermal conductor in FIG. 2.

Referring to FIG. 4, the graphite thermal conductor 100 includes a plurality of graphite bands 110, and these graphite bands 110 are laminated in the thickness direction T. In the present embodiment, the graphite thermal conductor 100 further includes a plurality of glue layers 120. The graphite bands 110 may be sequentially laminated by the glue layers 120. It should to note that, the graphite bands 110 have both thermal conductivity property and electrical conductivity property. Therefore, referring to FIG. 5, in another embodiment, the graphite thermal conductor 100 may also include two insulating layers 130 which may be attached to the surface of the graphite band 110 located at the outermost side via the glue layer 120, so as to provide electrical insulation. Additionally, the graphite thermal conductor 100 may also include two insulating layers 140 which may be attached to the side edges of the graphite bands 110 via the glue layers 120, so as to provide electrical insulation. The insulating layers 130 and the insulating layers 140 may be plastic films, e.g., PET material. However, in order to ensure that each of the graphite bands 110 and the heat generating component 14 have thermal coupling with high thermal conductivity therebetween, the distribution of the insulating layers 140 may avoid the segments where the side edge of each graphite band 110 and the heat generating component are thermally coupled, so as to prevent the increase of the thermal resistance between the heat generating component 14 and the graphite bands 110.

Figure 5:
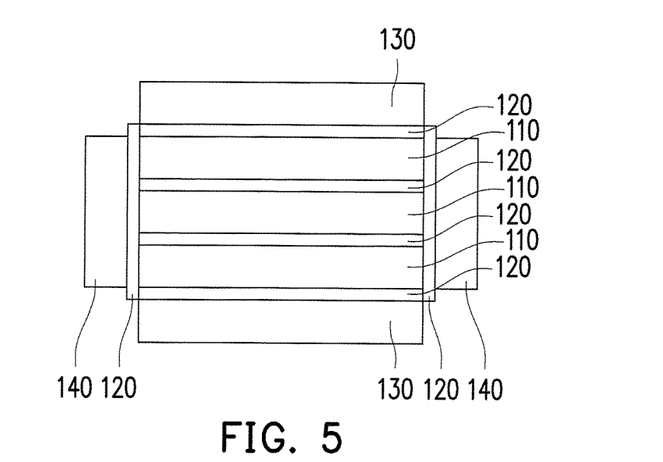
FIG. 5 is an enlarged cross-sectional view of a graphite thermal conductor according to another embodiment of the application.
Figure 6:
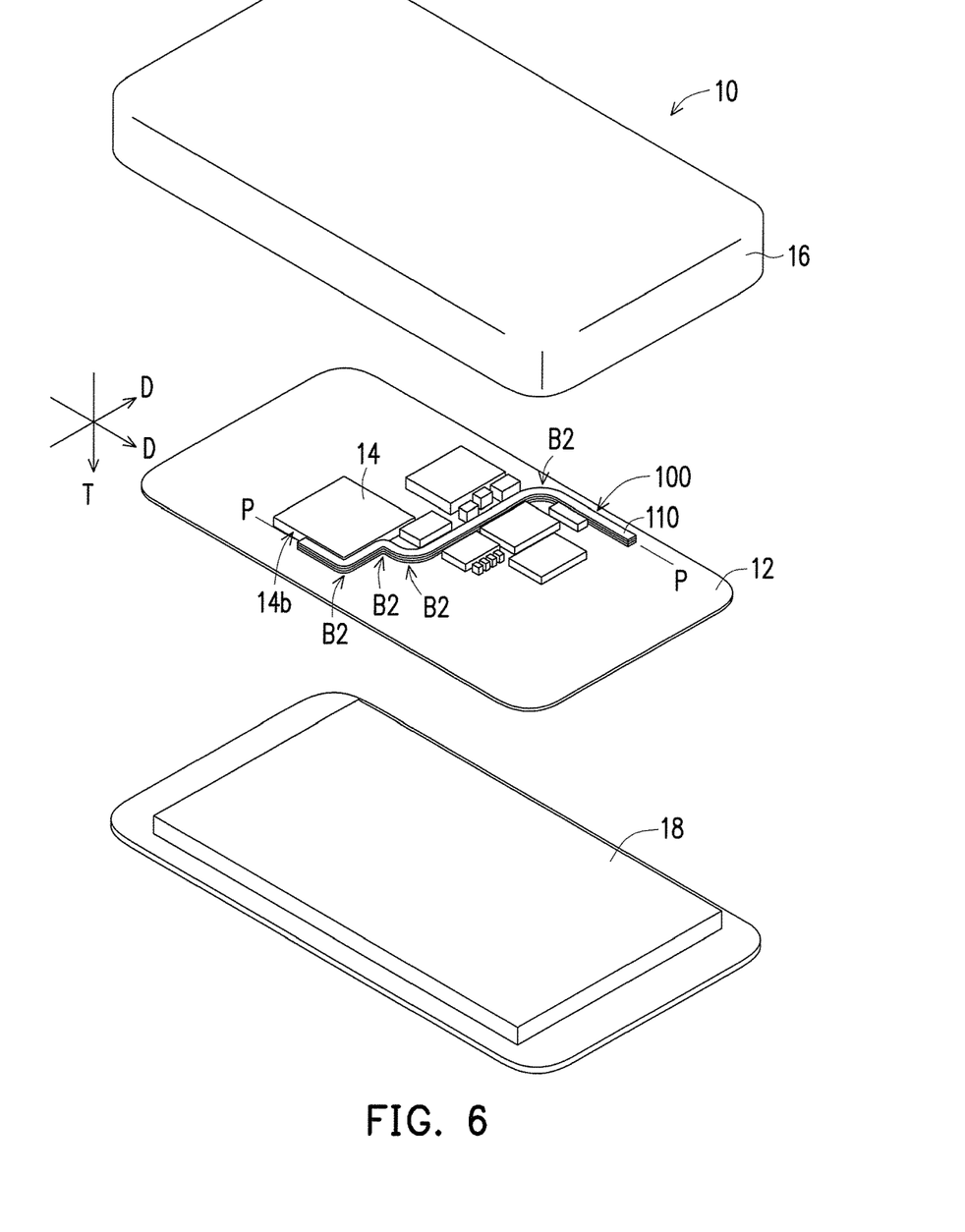
FIG. 6 is an exploded view of an electronic device according to another embodiment of the application.

Referring to FIG. 5, different from the embodiment of FIG. 2, in the present embodiment, the graphite thermal conductor 100 extends from the circuit board 12 to the side surface 14b of the heat generating component 14, but does not extend to the top surface 14a of the heat generating component 14. The extending path P of each graphite band 110 has a plurality of first bends B1 in a plane which is perpendicular to the thickness direction T. Therefore, the graphite thermal conductor 100 may extend from the circuit board 12 to the side surface 14b of the heat generating component 14, such that the side of each of the graphite bands 110 is thermally coupled to the side surface 14b of the heat generating component 14. In this configuration, each of the graphite bands 110 may bring into full play its high thermal conductivity characteristic, so as to rapidly dissipate heat from the heat generating component 14.

Figure 7A:
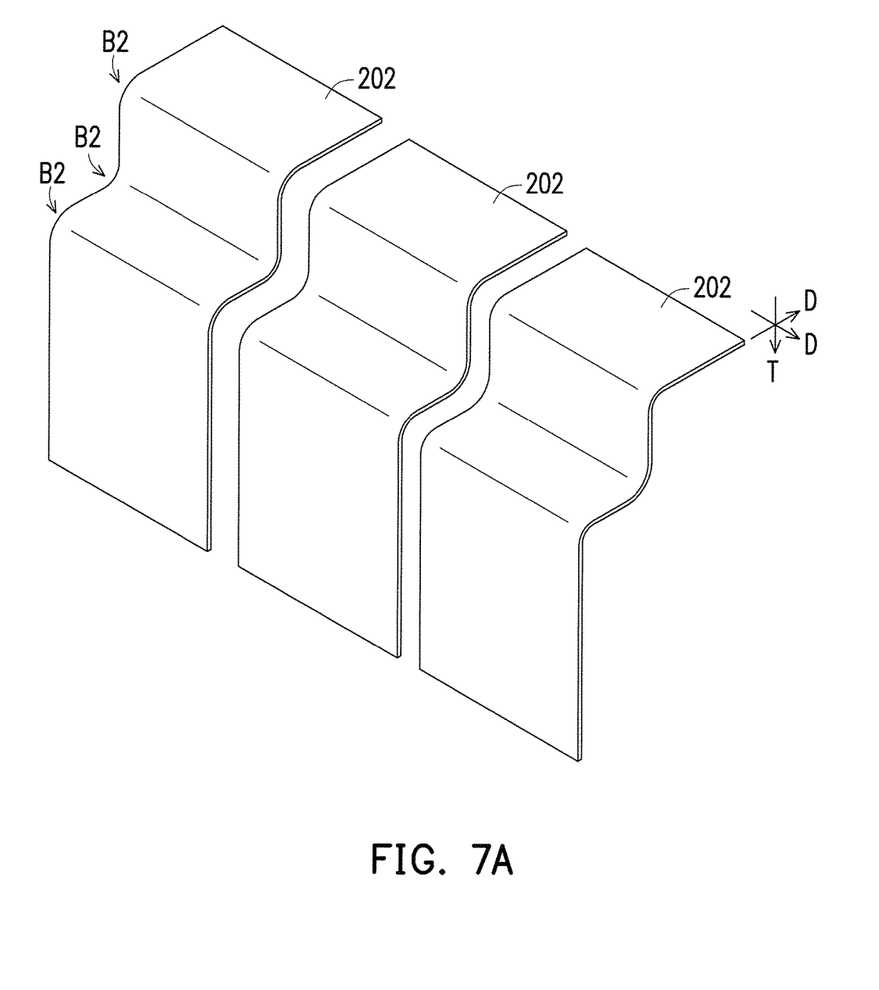
FIG. 7A through FIG. 7C illustrate a method for manufacturing graphite thermal conductor according to another embodiment of the application.
Figure 7B:
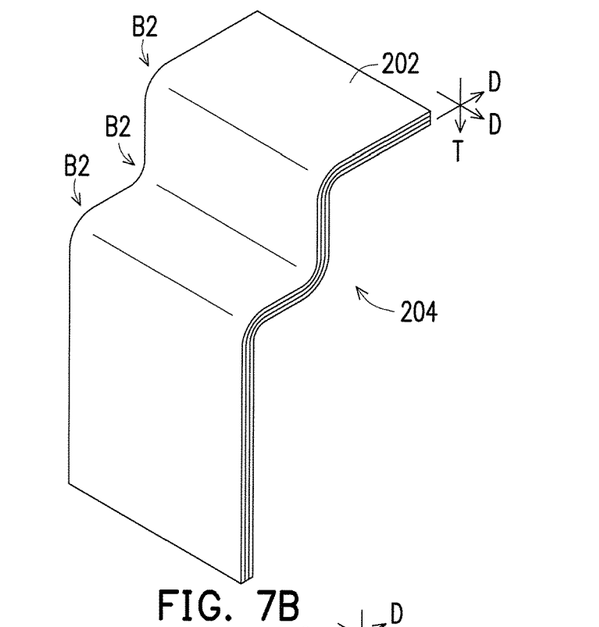
Figure 7C:
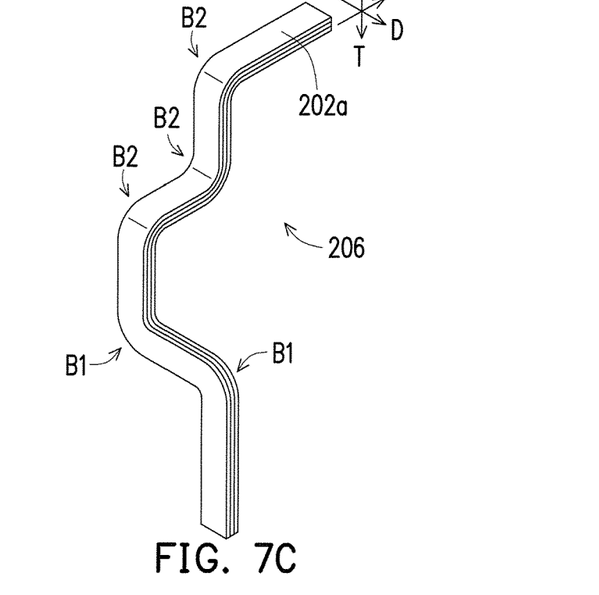

Referring to FIG. 7A through FIG. 7C which illustrate a method for manufacturing graphite thermal conductor according to another embodiment of the application. As shown in FIG. 7A, a plurality of graphite sheets 202 are bent according to a predetermined shape respectively. Next, as shown in FIG. 7B, the bent graphite sheets 202 are laminated to form a graphite laminated structure 204, wherein the graphite sheets 202 are laminated by using a bonding method. Then, as shown in FIG. 7C, the graphite laminated structure 204 is cut, so that each of the graphite sheets 202 becomes a graphite band 202a, and these graphite bands 202a (i.e., the graphite laminated structure 204 after cut) form a graphite thermal conductor 206.

The thermal conductivity coefficient of each of the graphite sheets 202 of FIG. 7A before bent in the extending plane D-D is greater than the thermal conductivity coefficient in the thickness direction T, so that the thermal conductivity coefficient of each graphite band 202a in the extending path P is greater than the thermal conductivity coefficient thereof in the thickness direction T. In addition, the extending path P of each graphite band 202a further has a plurality of second bends B2 in a plane, which is parallel to the thickness direction T, being formed in the step of bending the graphite sheets 202 as shown in FIG. 7A. In addition, the extending path P of each graphite band 202a further has a plurality of first bends B1 in a plane, which is perpendicular to the thickness direction T, being formed in the step of cutting the graphite laminated structure 204 as shown in FIG. 7C.

The graphite thermal conductor 100 of FIG. 2 may be manufactured by the steps of bending, laminating and cutting which are shown in FIG. 7A through FIG. 7C. The graphite thermal conductor 100 of FIG. 5 may be manufactured by the steps which are shown in FIG. 7B and FIG. 7C, and the bending step shown in FIG. 7A may be omitted.

In light of the foregoing, the graphite thermal conductor of the application uses the high thermal conductivity in the extending plane of the graphite bands to transmit the heat generated by the heat generating component, so as to rapidly dissipate the heat from the heat generating component. Furthermore, the laminated graphite bands may increase the amount of thermal conductivity per unit cross-sectional area.

Although the application has been described with reference to the above embodiments, it will be apparent to one of ordinary skill in the art that modifications to the described embodiments may be made without departing from the spirit of the application. Accordingly, the scope of the application will be defined by the attached claims and not by the above detailed descriptions.

What is claimed is:

1. A graphite thermal conductor configured to be thermally coupled to the heat generating component, comprising:
    a plurality of graphite bands laminated in a thickness direction, wherein a thermal conductivity coefficient of each graphite band in an extending path is greater than a thermal conductivity coefficient thereof in the thickness direction, the extending path of each graphite band has at least two first bends in a first plane and at least two second bends in a second plane, and the first plane is perpendicular to the thickness direction, and the second plane is parallel to the thickness direction,
    wherein at least one first bend of the at least two first bends is thermally coupled to two adjacent surfaces of the heat generating component, and at least one second bend of the at least two second bends is thermally coupled to two adjacent surfaces of the heat generating component.

2. The graphite thermal conductor as claimed in claim 1, further comprising:
    at least one glue layer sandwiched between adjacent graphite bands.

3. The graphite thermal conductor as claimed in claim 1, further comprising:
    an insulating layer disposed at an outer side surface of a graphite band located at outermost side.

4. The graphite thermal conductor as claimed in claim 1, further comprising:
    an insulating layer disposed at side edges of the graphite bands.

5. An electronic device, comprising:
    a circuit board;
    a heat generating component mounted on the circuit board; and
    a graphite thermal conductor thermally coupled to the heat generating component, the graphite thermal conductor comprising:
    a plurality of graphite bands laminated in a thickness direction, wherein a thermal conductivity coefficient of each graphite band in an extending path is greater than a thermal conductivity coefficient thereof in the thickness direction, the extending path of each graphite band has at least two first bends in a first plane and at least two second bends in a second plane, the first plane is perpendicular to the thickness direction, and the second plane is parallel to the thickness direction,
    wherein at least one first bend of the at least two first bends is thermally coupled to two adjacent surfaces of the heat generating component, and at least one second bend of the at least two second bends is thermally coupled to two adjacent surfaces of the heat generating component.

6. The electronic device as claimed in claim 5, wherein the graphite thermal conductor further comprises:
    at least one glue layer sandwiched between adjacent graphite bands.

7. The electronic device as claimed in claim 5, wherein the graphite thermal conductor further comprises:
    an insulating layer, disposed at an outer side surface of a graphite band located at outermost side.

8. The electronic device as claimed in claim 5, wherein the graphite thermal conductor further comprises:
    an insulating layer disposed at side edges of the graphite bands.

9. The electronic device as claimed in claim 5, further comprising:
    a housing accommodating the circuit board, the heat generating component and the graphite thermal conductor.

10. The electronic device as claimed in claim 9, wherein the graphite thermal conductor is thermally coupled to the housing.

11. The electronic device as claimed in claim 5, further comprising:
    a display mounted on the housing and electrically connected to the circuit board.

12. The electronic device as claimed in claim 5, wherein the heat generating component includes a central processing unit, a graphic processing unit, a charging integrated circuit, a power choke, a radio frequency power amplifier, or a power management processor.

* * * * *